United States Patent
Tanio

(10) Patent No.: US 9,219,448 B2
(45) Date of Patent: Dec. 22, 2015

(54) AMPLIFIER AND AMPLIFICATION METHOD

(71) Applicant: Masaaki Tanio, Tokyo (JP)

(72) Inventor: Masaaki Tanio, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/385,620

(22) PCT Filed: Mar. 28, 2013

(86) PCT No.: PCT/JP2013/002112
§ 371 (c)(1),
(2) Date: Sep. 16, 2014

(87) PCT Pub. No.: WO2013/145748
PCT Pub. Date: Oct. 3, 2013

(65) Prior Publication Data
US 2015/0072631 A1    Mar. 12, 2015

(30) Foreign Application Priority Data

Mar. 30, 2012   (JP) .................................. 2012-081595

(51) Int. Cl.
*H04B 1/04* (2006.01)
*H03F 1/32* (2006.01)
*H03F 3/24* (2006.01)

(52) U.S. Cl.
CPC ................ *H03F 1/3205* (2013.01); *H03F 1/32* (2013.01); *H03F 3/24* (2013.01); *H04B 1/0475* (2013.01); *H04B 2001/0425* (2013.01)

(58) Field of Classification Search
CPC .......... H03F 1/3247; H03F 2201/3233; H04B 1/0475
USPC ............... 455/114.2, 114.3, 115.1, 91, 127.1, 455/501, 63.1, 67.13; 375/295, 296, 284, 375/285
See application file for complete search history.

(56) References Cited

U.S. PATENT DOCUMENTS 7,170,342 B2 *  1/2007  Suzuki et al. ................. 330/149
7,333,559 B2 *  2/2008  Song et al. .................... 375/296

(Continued)

FOREIGN PATENT DOCUMENTS

JP    2005-269440 A    9/2005
JP    2007-74039 A     3/2007

(Continued)

OTHER PUBLICATIONS

International Search Report for PCT Application No. PCT/JP2013/002112, mailed on Jul. 2, 2013.

*Primary Examiner* — Sonny Trinh

(57) ABSTRACT

[Problem] To provide an amplifier and an amplification method in which degradation in the quality of the output signal is reduced. [Solution] This amplifier is characterized in having: an amplification unit; a power supply modulator for determining the modulation voltage applied to the amplification unit according to an input signal inputted into the amplification unit; a first predistorter for modeling the characteristics of the amplification unit and performing distortion compensation with respect to the amplification unit; a first controller for controlling the parameters of the first predistorter on the basis of an input signal inputted into the first predistorter and an output signal from the amplification unit; a second predistorter for modulating an input signal inputted into the power supply modulator; and a second controller for controlling the second predistorter on the basis of the input signal inputted into the power supply modulator and a signal from which the RF component of the drain voltage of an FET of the amplification unit has been removed; the amplifier performing a correction such that the signal from which the RF component of the drain voltage of the FET has been removed is linear.

8 Claims, 12 Drawing Sheets

(56) References Cited

U.S. PATENT DOCUMENTS

| | | | |
|---|---|---|---|
| 7,715,810 B2* | 5/2010 | Brobston | 455/114.2 |
| 7,772,925 B2* | 8/2010 | Bouny | 330/149 |
| 7,888,997 B2* | 2/2011 | Woo et al. | 330/10 |
| 7,991,074 B2* | 8/2011 | Nentwig | 375/297 |
| 8,417,194 B2* | 4/2013 | Huang | 455/114.3 |
| 9,106,188 B2* | 8/2015 | Tanio | 1/1 |

FOREIGN PATENT DOCUMENTS

| | | |
|---|---|---|
| JP | 2010-11348 A | 1/2010 |
| JP | 2010-74679 A | 4/2010 |
| WO | 2008/072700 A1 | 6/2008 |

* cited by examiner

Fig.10A $$u_i = \sum_{i,j} g_{i,j} |x_i|^{j-1} x_i$$

Fig.10B $$g = \min(\sum_i |x_i - \sum_j (g_{i,j} |y_i|^{(j-1)} y_i)|^2)$$

Fig.10C $$u_i = \sum_{i,j,t} g_{i,j,t} |x_{i-t}|^{j-1} x_{i-t}$$

Fig.10D $$g = \min(\sum_i |x_i - \sum_{j,t} (g_{i,j,t} |y_{i-t}|^{(j-1)} y_{i-t})|^2)$$

Fig.11A $$f(x) = x + 0.1 e^{\frac{x}{0.1}}$$

Fig.11B $$u'_i = |u_i| + 0.1 e^{\left|\frac{u_i}{0.1}\right|}$$

AMPLIFIER AND AMPLIFICATION METHOD

This application is a National Stage Entry of PCT/JP2013/002112 filed on Mar. 28, 2013, which claims priority from Japanese Patent Application 2012-081595 filed on Mar. 30, 2012, the contents of all of which are incorporated herein by reference, in their entirety.

TECHNICAL FIELD

The present invention relates to an amplifier and an amplification method.

BACKGROUND ART

Modulation formats such as QPSK (Quadrature Phase Shift Keying) and Multilevel QAM (Quadrature Amplitude Modulation) are adopted as a digital modulation scheme used in today's wireless communications. In these modulation formats, transition between symbols entails amplitude modulation. Accordingly, the amplitude of transmission signals modulated by these modulation formats changes with time. A transmission signal combined with a carrier signal is referred to as an input signal. Research and development on amplifiers amplifying an input signal when the input signal is transmitted is being conducted. Note that the input signal is sometimes referred to as an RF (Radio Frequency) signal.

Polar modulation is known as a scheme that amplifies an input signal with high efficiency so that the output signal intensity widely changes in a dynamic range. Known examples of polar modulation schemes are EER (Envelope Elimination and Restoration) and ET (Envelope Tracking). In the EER, first a transmission signal is split into a phase component and an amplitude component. The phase component that has a certain amplitude is input into an amplification unit. The amplification unit operates around the saturation point at which the maximum efficiency is achieved. On the other hand, the amplitude component is input into a power supply modulator, where the amplitude component is amplified. The output voltage from the power supply modulator is used as the power supply for the amplification unit. The amplification unit having such a configuration acts as a multiplier that combines the phase and amplitude components of a transmission signal.

In the ET scheme, on the other hand, the amplitude component of a transmission signal is amplified by a power supply modulator and the output voltage from the power supply modulator is used as the power supply for the amplification unit. Only a phase-modulated signal that has a certain amplitude is input into the amplification unit in the EER scheme whereas a transmission signal including both of the amplitude component and the phase component is input in the amplification unit in the ET scheme. The ET scheme is less efficient in amplification than the EER scheme. However, the ET scheme does not require high accuracy of timing of combining the amplitude and phase components in the amplification unit. Accordingly, the ET scheme can be implemented more easily than the EER scheme.

As a related technique, an ET amplifier is disclosed in Patent Literature 1.

An amplifier according to the related technique and voltage waveforms around a power supply modulator and an amplitude circuit will be described with reference to FIG. 8. The amplifier includes an amplification unit 100, a power supply modulator 300 and a load 1900. The amplification unit 100 includes a choke coil 101, an amplification circuit 102 and a matching circuit 103. A configuration in which an FET (field effect transistor) is used as the amplification circuit 102 will be described as an example.

The power supply modulator 300 amplifies an input signal and output a voltage. The choke coil 101 inhibits high-frequency components included in current input in the amplification unit 100 that has a carrier frequency from passing through the choke coil 101. The amplification circuit 102 allows current amplified in proportion to current input at the gate terminal on the basis of power supplied from the power supply modulator 300 to flow from the drain terminal to the source terminal. The matching circuit 103 performs impedance matching for the amplification circuit 102.

An operation of the amplifier according to the related technique will be described.

First, the power supply modulator 300 amplifies the voltage 3000 of an envelope signal extracted from a transmission signal and outputs an amplified voltage 3100. In the amplification circuit 102, on the other hand, current amplified in proportion to an input signal input into the gate terminal on the basis of power supplied from the power supply modulator 300 flows from the drain terminal to the source terminal. In the load 1900, a voltage proportional to the current flowing from the drain terminal to the source terminal is output. The voltage 3200 at the drain terminal is equal to the sum of a voltage 3400$a$ having a frequency component nearly equal to that of the amplified voltage 3100 and a voltage 3400$b$ having a carrier frequency component.

As shown in FIG. 8, the power supply modulator 300 amplifies the voltage 3000 of the envelope signal and outputs the amplified voltage 3100. If the value of the impedance of the choke coil 101 can be assumed to be negligible in the frequency band of the amplified voltage 3100, the amplified voltage 3100 and the voltage 3400$a$ will have the same waveform. In other words, the voltage 3000 of the envelope signal is proportional to the voltage 3400$a$. FIGS. 9A and 9B show the relationship between the voltage 3000 of the envelope signal and the voltage 3400$a$. Ideally, the voltage 3000 of the envelope signal is proportional to the voltage 3400$a$ as in FIG. 9A. However, a certain degree of deviation from the proportionality was expected since the gain of an operational amplifier or the like that constitutes the power supply modulator 300 is frequency dependent.

CITATION LIST

Patent Literature

[Patent Literature 1] Japanese Laid-open Patent No. 2010-74679

SUMMARY OF INVENTION

Technical Problem

However, experiments conducted by the inventor have found that more measurement values of the voltage 3000 of the envelope signal and the voltage 3400$a$ deviated from the proportionality than expected. FIG. 9B shows the distribution of measurement values of the voltage 3000 of the envelope signal and the voltage 3400$a$. The deviation from the proportionality has prevented proper control of the voltage 3400$a$ corresponding to the input signal. There was the problem of degradation of the quality of an output signal of the amplification circuit 102.

An object of the present invention is to solve the above-mentioned problem and provide an amplifier and an amplification method by which degradation of the quality of an output signal is reduced.

Solution to Problem

An amplifier according to the present invention includes an amplification unit, a power supply modulator determining a modulation voltage to be applied to the amplification unit according to an input signal input into the amplification unit, a first predistorter modeling a characteristic of the amplification unit and compensating for distortion in the amplification unit, a first controller controlling a parameter of the first predistorter on the basis of an input signal input into the first predistorter and an output signal from the amplification unit, a second predistorter modulating an input signal input into the power supply modulator, and a second controller controlling the second predistorter on the basis of a signal from which a radio frequency component of a drain voltage of a field effect transistor in the amplification unit has been removed and the input signal input into the power supply modulator, wherein correction is performed such that the signal from which the radio frequency component of the drain voltage of the field effect transistor has been removed is linearized.

An amplification method according to the present invention is the amplification method for amplifying an input signal input into an amplification unit, the amplification method including determining, in a power supply modulator, a modulation voltage to be applied to the amplification unit according to an input signal input into the amplification unit, controlling a parameter of a first predistorter which models a characteristic of the amplification unit to compensate for distortion in the amplification unit, on the basis of an input signal input into the first predistorter and an output signal from the amplification unit, modulating, in a second predistorter, an input signal input into the power supply modulator, controlling the second predistorter on the basis of a signal from which a radio frequency component of a drain voltage of an field effect transistor in the amplification unit has been removed and the input signal input into the power supply modulator, and performing correction such that the signal from which the radio frequency component of the drain voltage of the field effect transistor has been removed is linearized.

Advantageous Effects of Invention

The present invention can provide an amplifier and an amplification method by which degradation of the quality of an output signal is reduced.

BRIEF DESCRIPTION OF DRAWINGS

FIG. 9A shows an example of the relationship between the voltage 3300 of an envelope signal and voltage 3400a;

FIG. 9B shows an example of the relationship between the voltage 3300 of an envelope signal and voltage 3400a;

FIG. 10A shows a relational expression relating to an example of control by a controller;

FIG. 10B shows a relational expression relating to an example of control by the controller;

FIG. 10C shows a relational expression relating to an example of control by the controller;

FIG. 10D shows a relational expression relating to an example of control by the controller;

FIG. 11A shows a relational expression relating to an example of control by a shaping unit;

FIG. 11B shows a relational expression relating to an example of control by the shaping unit.

DESCRIPTION OF EMBODIMENTS

The best mode for carrying out the present invention will be described in detail with reference to drawings. However, the present invention is not limited to the embodiments described below.

The First Embodiment

Figure 1:
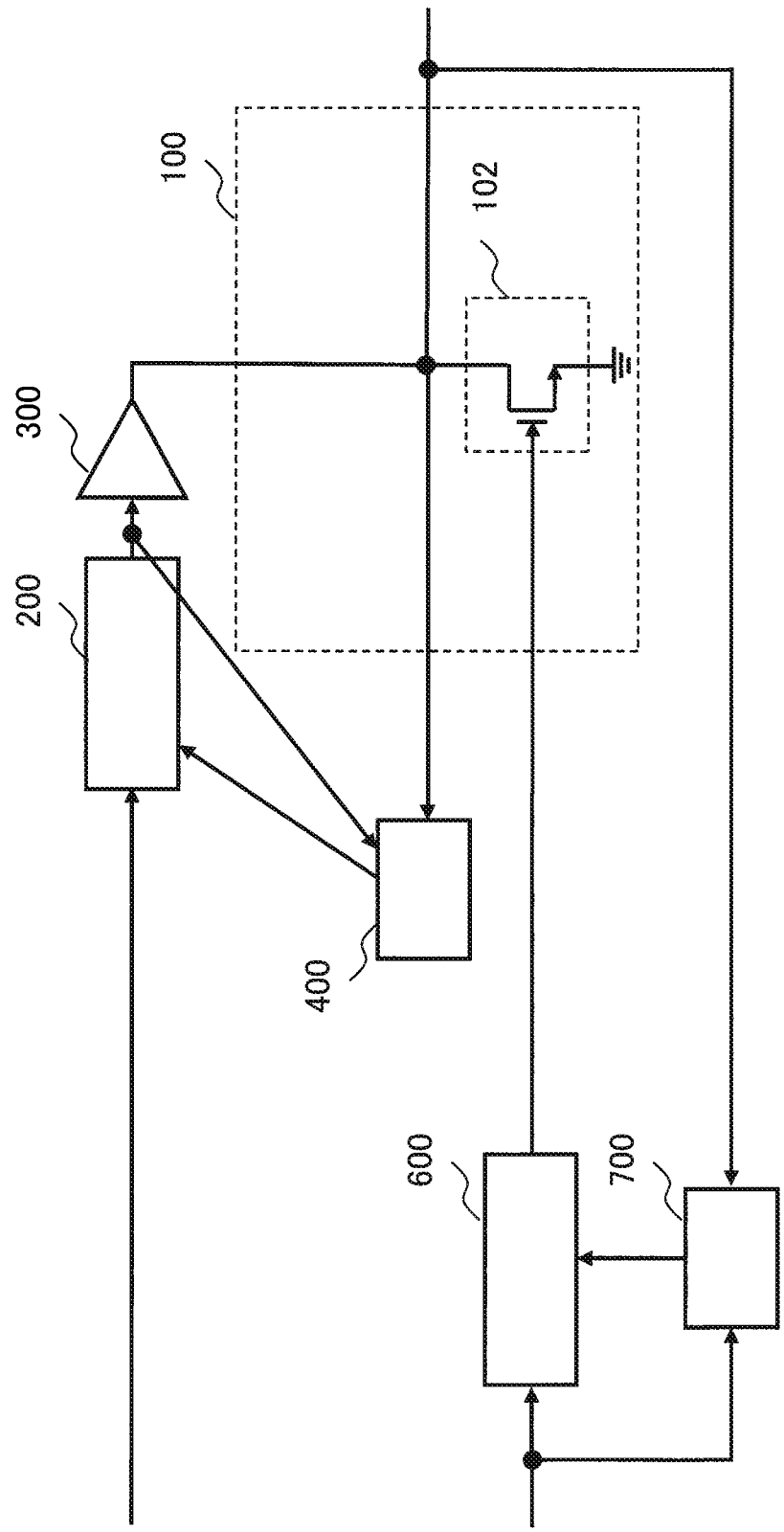
FIG. 1 shows an example of functional blocks of an amplifier according to a first embodiment.

Referring to FIG. 1, a configuration of an amplifier according to the first embodiment will be described.

The amplifier according to this embodiment includes an amplification unit 100, a power supply modulator 300, a first predistorter 600, a first controller 700, a second predistorter 200, and a second controller 400. The power supply modulator 300 determines a modulation voltage to be applied to the amplification unit according to an input signal input into the amplification unit. The first predistorter 600 models a characteristic of the amplifier and compensates for distortion in the amplification unit. The first controller 700 controls parameters of the first predistorter on the basis of the input signal input into the first predistorter and the output signal from the amplification unit. The second predistorter 200 modulates an input signal input into the power supply modulator. The second controller 400 controls the second predistorter 200 on the basis of a signal from which the RF component of the drain voltage of an FET (Field Effect Transistor) 102 in the amplification unit 100 has been removed and the input signal input into the power supply modulator 300. The amplifier according to this embodiment performs a correction such that the signal from which the RF component of the drain voltage of the FET 102 has been removed is linearized.

The amplifier according to this embodiment reduces degradation of the quality of an output signal.

The Second Embodiment

Figure 2:
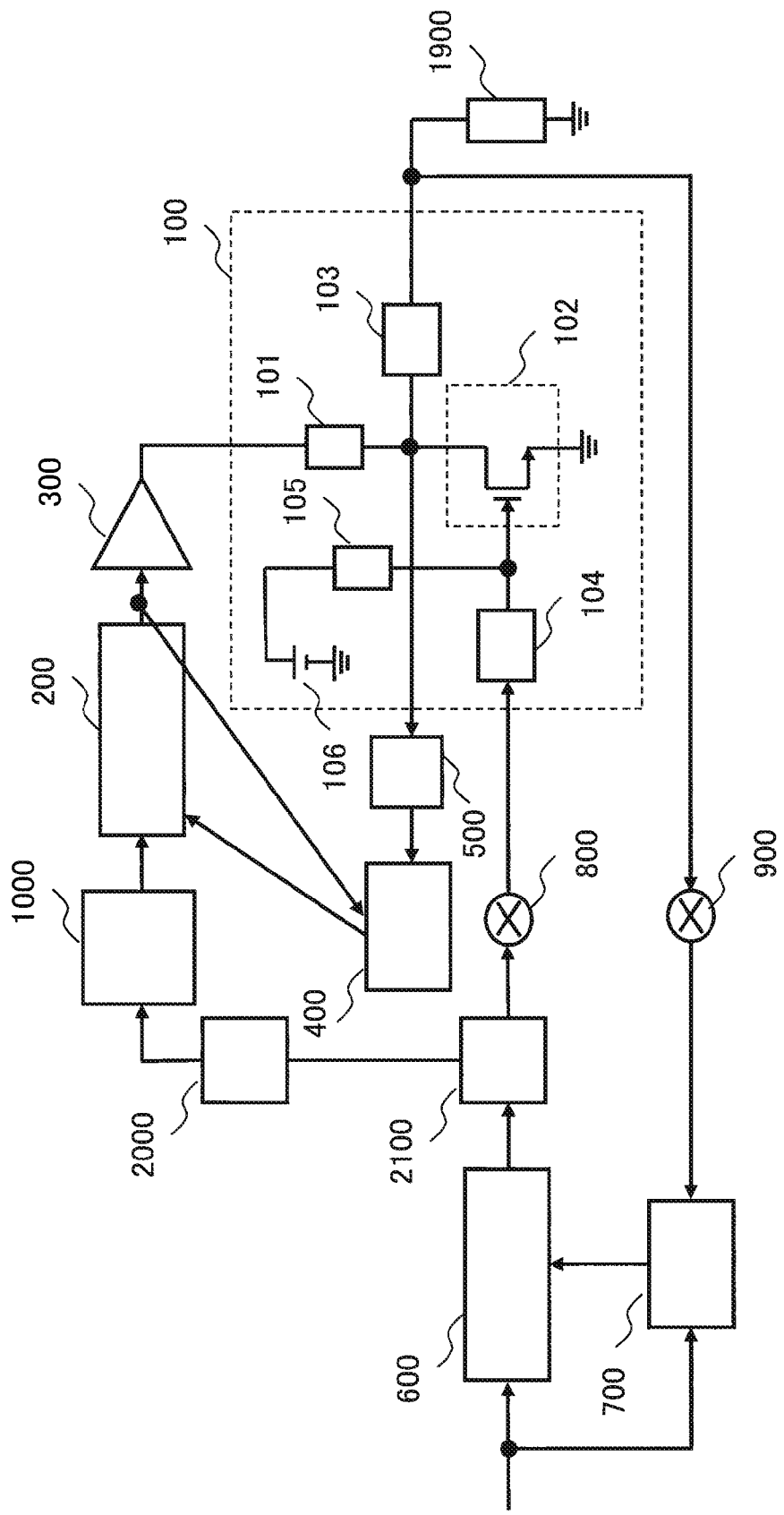
FIG. 2 shows an example of functional blocks of an amplifier according to a second embodiment.

Referring to FIG. 2, a configuration of an amplifier according to a second embodiment will be described.

The amplifier includes an amplification unit 100, a predistorter 200, a power supply modulator 300 and a controller 400.

An input signal is input into the amplification unit 100. The amplification unit 100 amplifies the input signal and outputs the amplified input signal.

The amplifier according to this embodiment further includes a filter 500. The amplification unit 100 includes a choke coil 101 and an amplification circuit 102. A configuration using an FET as the amplification circuit 102 will be described as an example.

The amplification unit 100 according to this embodiment further includes a matching circuit 103.

The amplifier according to this embodiment further includes a predistorter 600, a controller 700, an up-converter 800, a down-converter 900, a shaping unit 1000, an envelope extractor 2000, a branching unit 2100, and a load 1900. The amplification unit 100 further includes a matching circuit 104, a choke coil 105 and a power supply 106.

The predistorter 200 adds distortion to an input electrical signal and outputs the electrical signal to which the distortion has been added. In this embodiment, an envelope signal extracted from a transmission signal is input into the predistorter 200. The predistorter 200 adds distortion to the envelope signal. The predistorter 200 outputs the envelope signal to which the distortion has been added. The input signal is a signal obtained by combining the transmission signal and a carrier signal. The distortion of the electrical signal includes a change in the amplitude or phase of the signal at a given time instant.

The power supply modulator 300 amplifies an input signal and outputs a voltage. In this embodiment, the envelope signal to which distortion has been added by the predistorter 200 is input into the power supply modulator 300. The power supply modulator 300 amplifies the envelope signal to which distortion has been added and outputs a voltage. The power supply modulator 300 supplies power to the amplification unit 100 on the basis of the envelope signal to which distortion has been added. The power supply modulator 300 may be implemented by a combination of an operational amplifier and switching, for example.

Figure 8:
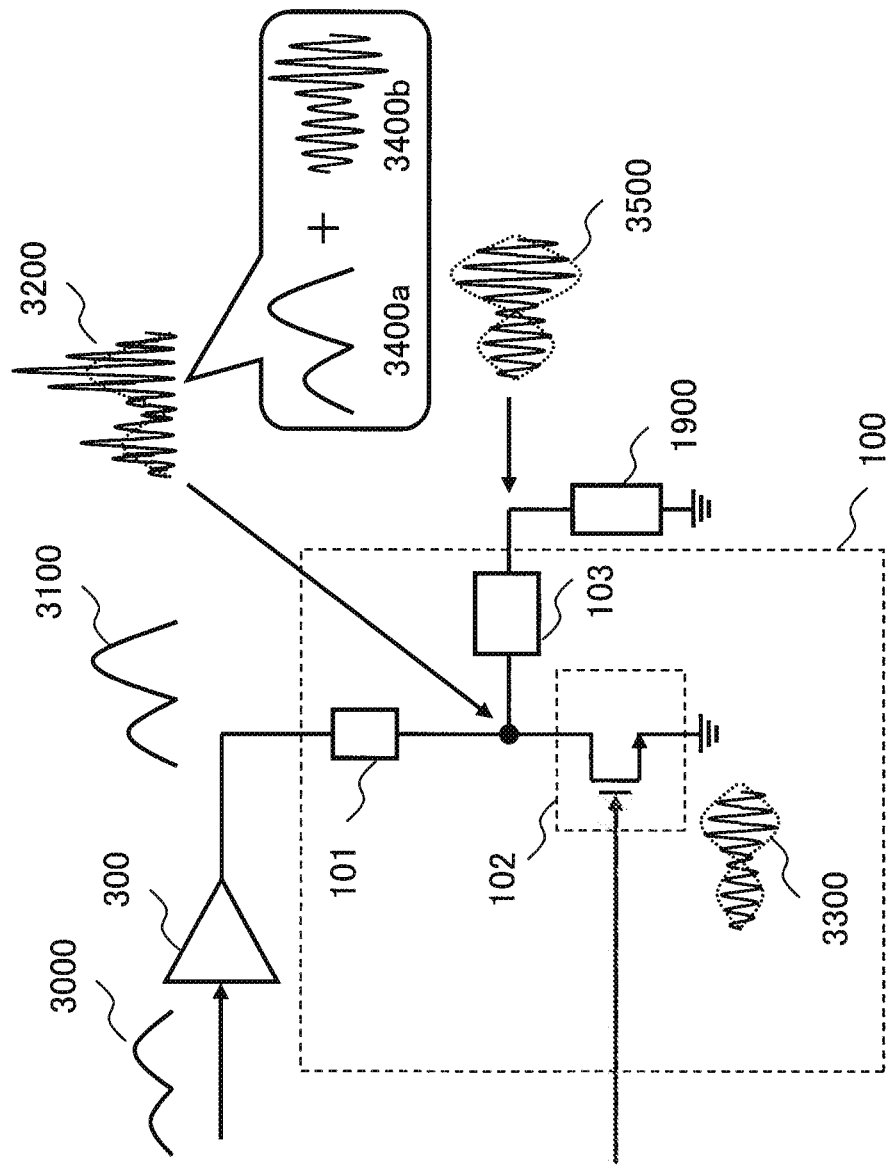
FIG. 8 shows an amplifier according to a related technique and voltage waveforms near a power supply modulator and an amplification circuit.

The controller 400 controls distortion added by the predistorter 200 on the basis of an output signal from the amplification unit 100 and the envelope signal to which distortion has been added by the predistorter 200. In this embodiment, voltage 3200 and/or voltage 3500 in FIG. 8 is referred to as the output signal from the amplification unit 100.

The choke coil 101 is connected between the output terminal of the power supply modulator 300 and the drain terminal of the amplification circuit 102. The choke coil 101 inhibits high-frequency components included in current flowing from the power supply modulator 300 to the amplification circuit 102 that has a carrier frequency from passing through the choke coil 101. In this way, the power supply modulator 300 supplies power to the amplification circuit 102 through the choke coil. 101.

The amplification circuit 102 is supplied with power from the power supply modulator 300 through the choke coil 101. The amplification circuit 102 amplifies an input signal. The amplification circuit 102 generates an output signal on the basis of the amplified input signal and outputs the output signal. Specifically, current amplified in proportion to current corresponding to an input signal input at the gate terminal flows from the drain terminal to the source terminal. A voltage proportional to the current flowing from the drain terminal to the source terminal is output in a load not depicted.

The filter 500 is connected between the drain terminal of the amplification circuit 102 and the controller 400. The filter 500 attenuates the voltage of a component that has a carrier frequency contained in the output signal output from the amplification circuit 102. The filter 500 outputs the output signal from which the above component has been attenuated to the controller 400.

The matching circuit 103 is connected to the output terminal of the amplification circuit 102 and the load not depicted. The matching circuit 103 performs impedance matching for the amplification circuit 102. The amplification circuit 102 outputs an output signal to the load not depicted, through the matching circuit 103. The controller 400 controls distortion added by the predistorter 200 on the basis of the output signal input from the amplification circuit 102 into the matching circuit 103 and an envelope signal that has been extracted from a transmission signal and to which distortion has been added by the predistorter 200. Specifically, the output signal input from the amplification circuit 102 into the matching circuit 103 is input into the controller 400 through the filter 500. The controller 400 controls distortion added by the predistorter 200 on the basis of the output signal from the filter 500 and the envelope signal to which distortion has been added by the predistorter 200.

Next, a procedure for controlling the predistorter 200 performed by the controller 400 on the basis of an output signal from the amplification unit 100 and an envelope signal that has been extracted from a transmission signal and to which distortion has been added by the predistorter 200 will be described as a specific example. Here, an example will be described with use of an indirect learning algorithm.

An envelope signal input into the predistorter 200 is denoted by $x_i$, the envelope signal to which distortion has been added by the predistorter 200 is denoted by $u_i$, an output signal output from the amplification unit 100 is denoted by $y_i$, the order of a polynomial model is denoted by j and a time-series tap is denoted by i. Here, the predistorter 200 adds distortion to the envelope signal input into the predistorter 200 according to a relational expression including a parameter g shown in FIG. 10A. Note that the parameter g is determined so that the parameter g satisfies the relational expression shown in FIG. 10B. The parameter g can be obtained by using the least-squares method, the gradient method or the like. The controller 400 determines the parameter in this way. The controller 400 uses the determined parameter to control distortion added by the predistorter 200. The predistorter 200 adds the inverse of distortion of the output signal that occurs in a circuitry subsequent to the power supply modulator 300 to the envelope signal by the above processing.

Note that the predistorter 200 may control distortion according to a relational expression shown in FIG. 10C, for example, in order to compensate for distortion due to a memory effect of the amplification unit 100. The relational expression shown in FIG. 10C is the relational expression to which the contribution of the tap is added to the relational expression shown in FIG. 10A. The parameter g can be determined so that the parameter g satisfies a relational expression shown in FIG. 10D, for example.

Figure 12:
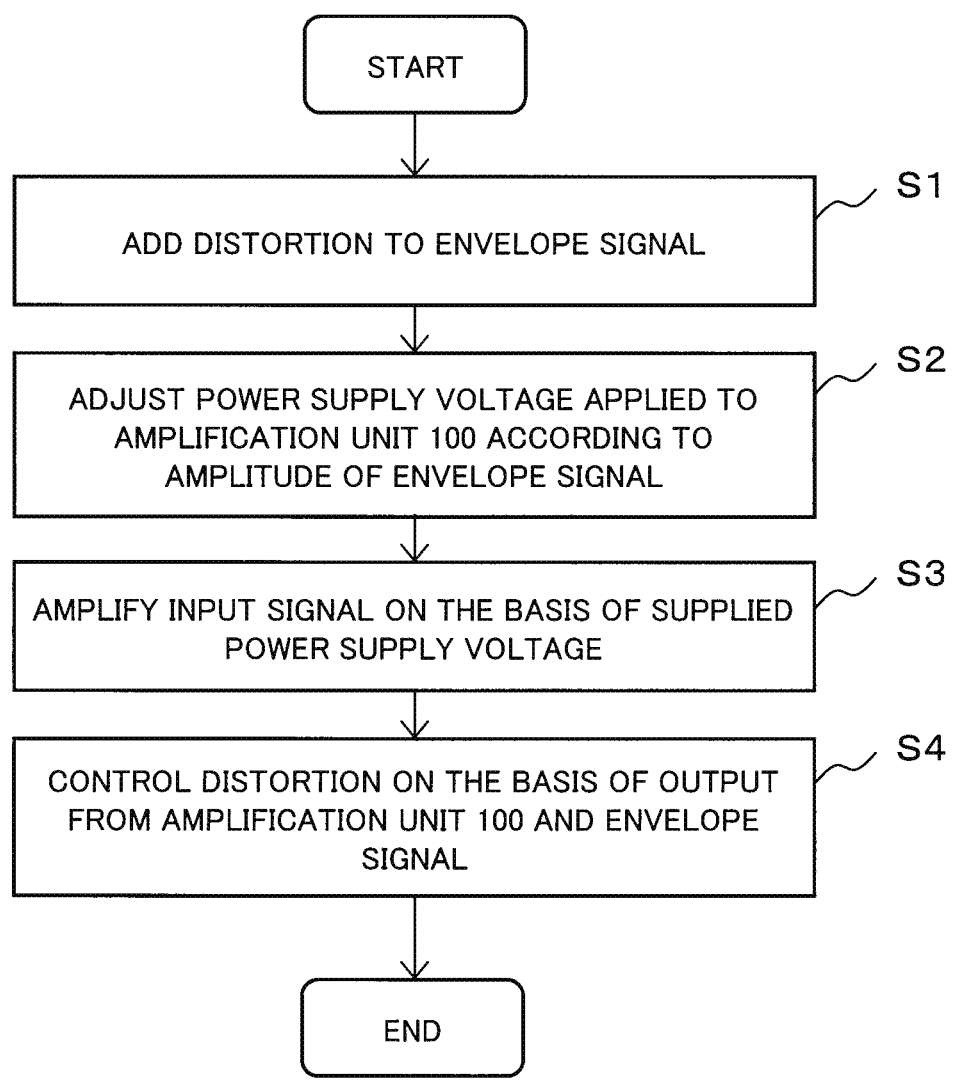
FIG. 12 is a flowchart showing an example of operation of the amplifier according to the first embodiment.

An operation of the amplifier according to this embodiment will be described with reference to a flowchart in FIG. 12.

First, an input signal which is a transmission signal combined with a carrier signal, and an envelope signal extracted from the input signal are input into the amplifier. The envelope signal is input into the predistorter 200. The predistorter 200 adds distortion to the input envelope signal (step S1 of FIG. 12). The predistorter 200 outputs the envelope signal to which the distortion has been added. The power supply modulator 300 increases or decreases a power supply voltage to be applied to the amplification unit 100 in accordance with the amplitude of the envelope signal to which the distortion has been added by the predistorter 200 (step S2). The amplification unit 100 amplifies the input signal (step S3). Specifically, the amplification unit 100 amplifies the input signal on the basis of the power supply voltage supplied from the power supply modulator 300. The envelope signal to which distortion has been added by the predistorter 200 and an output signal from the amplification unit 100 are input into the controller 400. The controller 400 controls distortion added by the predistorter 200 on the basis of the output signal from the amplification unit 100 and the envelope signal (step S4).

Causes of degradation of the quality of an output signal will be discussed below.

Figure 9A:
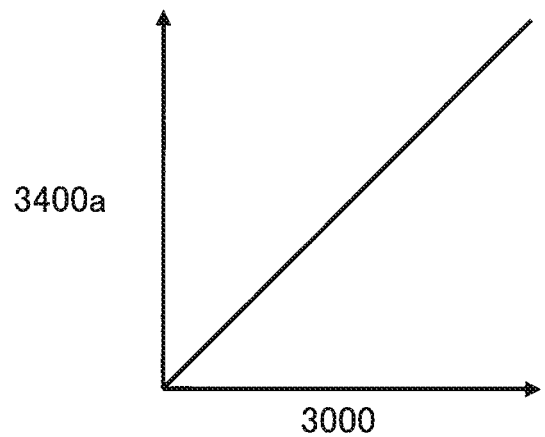
Figure 9B:
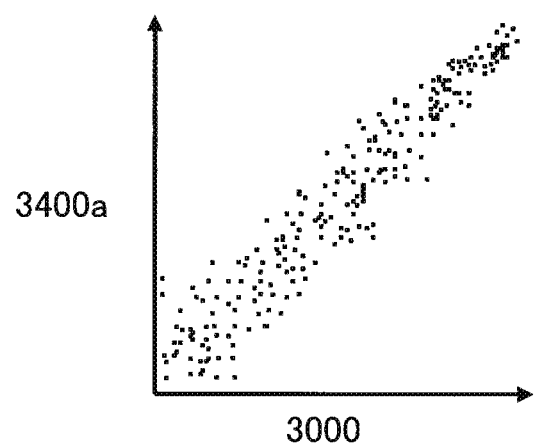

Deviations from the proportionality of relationship between the voltage 3000 of the envelope signal and the voltage 3400$a$ shown in FIG. 9B result from characteristics of the power supply modulator 300 and the subsequent circuitry. For example, the gain of the power supply modulator 300 is frequency dependent and therefore the amplitude characteristics of the power supply modulator 300 vary depending on frequency. Furthermore, the impedance of the choke coil 101 is not zero in the frequency band of the amplified voltage 3100. As the communication bandwidths increase, the frequency bands of envelope signals are expanding. Deviations from the proportionality caused by the characteristics described above are becoming more and more significant.

A transmission signal is input into the predistorter 600. The predistorter 600 adds distortion to the input transmission signal. The predistorter 600 outputs the transmission signal to which the distortion has been added to the branching unit 2100. Specifically, the predistorter 600 adds distortion which is controlled by the controller 700 to the input transmission signal. A specific example of procedure for adding distortion by the predistorter 600 will be described later.

The branching unit 2100 splits the transmission signal to which the distortion has been added by the predistorter 600 into two and outputs one of the signals to the envelope extractor 2000 and the other signal to the up-converter 800.

The up-converter 800 combines the transmission signal to which the distortion has been added by the predistorter 600 with a carrier signal not depicted, to generate an input signal. The up-converter 800 outputs the input signal. The transmission signal is up-converted according to the procedure described above.

The down-converter 900 combines an output signal from the amplification unit 100 with a carrier signal not depicted. The down-converter 900 down-converts the output signal according to the procedure described above. The down-converter 900 outputs the down-converted signal to the controller 700. The up-converter 800 and the down-converter 900 are implemented by commonly-used mixers.

The envelope extractor 2000 extracts an envelope component from the transmission signal that has been input from the branching unit 2100 and to which distortion has been added. The envelope extractor 2000 outputs the extracted envelope component to the shaping unit 1000 as an envelope signal.

The shaping unit 1000 performs shaping processing on a voltage-waveform in accordance with the amplitude of the voltage of the envelope signal.

The processing at the shaping unit 1000 will be described below in detail. It is assumed that a shaping function is a function expressed by a relational expression shown in FIG. 11A. The transmission signal to which distortion has been added by the predistorter 600 is denoted by $u_t$. An output signal from the shaping unit 1000 can be expressed by a relational expression shown in FIG. 11B.

The same signal as the transmission signal input into the predistorter 600 is input into the controller 700. The controller 700 obtains a distortion characteristic of the output signal from the amplification unit 100 or its inverse on the basis of the same signal as the transmission signal input into the predistorter 600 and a signal input from the down-converter 900. The controller 700 controls the predistorter 600 on the basis of the obtained result.

An output signal from the shaping unit 1000 is input into the predistorter 200. The predistorter 200 adds distortion to the output signal from the shaping unit 1000. The predistorter 2000 outputs the signal to which distortion has been added.

The controller 400 controls distortion added by the predistorter 200 on the basis of the output signal from the shaping unit 1000 and the output signal from the amplification circuit 102. The filter 500 reduces the voltage of components that has the carrier frequency band contained in a signal input at the drain terminal of the amplification circuit 102. The voltage resulting from the reduction of the voltage of the components in the carrier frequency band by the filter 500 and applied to the drain terminal of the amplification circuit 102 is input into the controller 400. The controller 400 controls distortion added by the predistorter 200 on the basis of the output signal from the shaping unit 1000 and the voltage input from the filter 500.

The amplifier according to this embodiment includes the predistorter 200 and the controller 400. An envelope signal that has been extracted from a transmission signal and to which distortion has been added by the predistorter 200 is input into the predistorter 200. The predistorter 200 adds distortion to the envelope signal. The controller 400 controls distortion added by the predistorter 200 on the basis of an output signal from the amplification unit 100 and the envelope signal. The inverse of distortion of the output signal that occurs in a circuitry subsequent to the power supply modulator 300 is added to the envelope signal. Distortion that occurs in the power supply modulator 300 and the subsequent circuitry is added to the envelope signal to which the inverse of distortion has been added by the predistorter 200. This inhibits deviation from the proportionality of relationship between the voltage 3000 of the envelope signal and the voltage 3400$a$ as shown in FIG. 9B. As a result, proper control of the voltage 3400$a$ corresponding to the input signal is enabled and degradation of the quality of the output signal from the amplification unit 100 is reduced.

In the amplifier according to this embodiment, the controller 400 controls distortion added by the distorter 200 on the basis of the envelope signal to which distortion has been added by the predistorter 200 and the output signal from the amplification unit 100.

In the amplifier according to this embodiment, the controller 400 controls distortion added by the predistorter 200 on the basis of the output signal output from the choke coil 101 and the envelope signal.

Thus, the controller 400 more properly determines the inverse of distortion of the output signal that occurs in the power supply modulator 300 and the circuitry that succeeds the power supply modulator 300 and precedes the drain terminal of the amplification circuit 102.

Suitably, the controller 400 controls distortion added by the predistorter 200 on the basis of the output signal from the filter 500 and the envelope signal.

Since impedance matching is performed by the matching circuit 103 in the amplifier according to this embodiment, distortion of the output signal that occurs in the amplification circuit 102 can be inhibited.

The matching circuit 104 matches the output impedance of the stage preceding the up-converter 800 and the input impedance of the amplification circuit 102.

The choke coil 105 transmits a bias voltage of the power supply 106 to the amplification circuit 102 to determine the gate bias of the amplification circuit 102.

The amplifier according to this embodiment includes two predistorters, namely the predistorter 600 and the predistorter 200. The compensation for distortion contained in the output signal from the amplification circuit 102 is handled and shared by the predistorter 600 and the predistorter 200. Since the load of compensation on each of the predistorter 600 and the predistorter 200 is reduced, distortion in a wider range can be compensated for by the predistorter 600 than in a configuration where only one predistorter compensates for distortion. Consequently, the predistorter 200 can further compensate for distortion of the output signal from the amplification unit 100. Accordingly, the quality of the output signal is improved.

The Third Embodiment

An amplifier according to a third embodiment will be described with reference to FIG. 3.

The amplifier according to the third embodiment further includes a DSP (Digital Signal Processor) 1800, a DAC (Digital to Analog Converter) 1100, an ADC (Analog to Digital Converter) 1700, LPFs (Low Pass Filters) 1300, 1600, and a BPF (Band Pass Filter) 1200. The DSP 1800 includes logic outputs O1, O2 and logic inputs I1, I2. Note that DSP, DAC, ADC, LPF and BPF are abbreviated word of Digital Signal Processor, Digital to Analog Converter, Analog to Digital Converter, Low Pass Filters, and Band Pass Filter, respectively.

The DSP 1800 outputs a digital signal of a baseband signal through output terminal O2. The digital signal of the baseband signal is input into the DAC 1100. The DAC 1100 converts the input digital signal to an analog signal and outputs the analog signal as a transmission signal. The transmission signal is input into the up-converter 800 through the LPF 1300. The up-converter 800 combines a carrier signal output from an oscillator not depicted, with the transmission signal to generate an input signal. The up-converter 800 outputs the generated input signal. The input signal is input into the amplification unit 100 through the BPF 1200.

While most part of an output signal from the amplification unit 100 is provided to the load 1900, a part of the output signal is down-converted to a baseband signal through the down-converter 900 and the LPF 1600. The baseband signal resulting from the down-conversion is converted to a digital signal at the ADC 1700. The digital signal resulting from the conversion is input at input terminal I2 of the DSP 1800.

The predistorter 600 and the controller 800, which are responsible for compensation for distortion in the amplification unit 100, are aggregated into the DSP 1800.

A procedure for the controller 700 to calculate a distortion characteristic of an output signal from the amplification unit 100 or its inverse will be described. While various implementations and algorithms have been proposed, an indirect learning algorithm which uses a polynomial model will be described here as an example.

Figure 3:
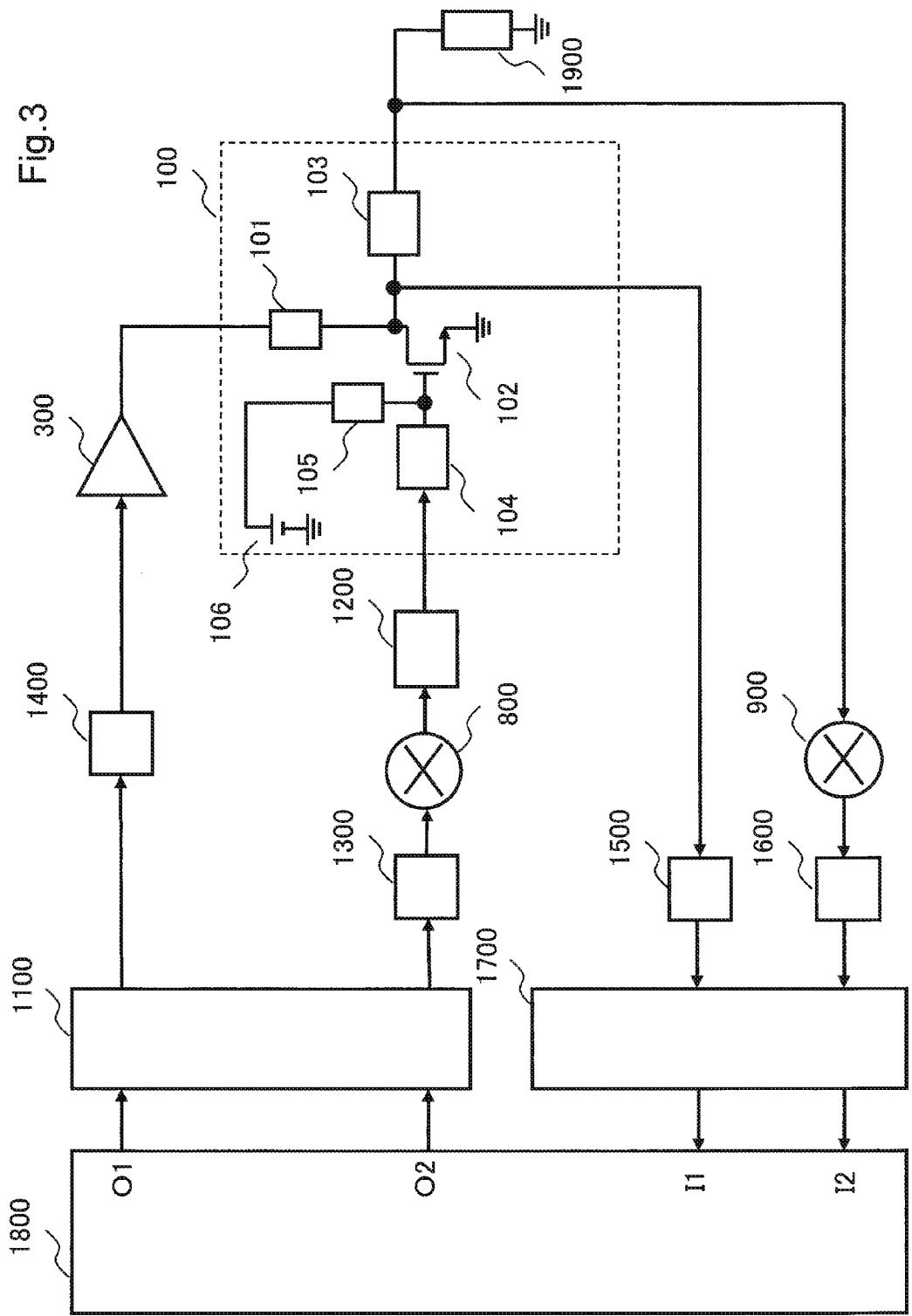
FIG. 3 shows an example of functional blocks of an amplifier according to a third embodiment.

An input baseband signal is denoted by $x_i$, a transmission signal to which distortion has been added by the predistorter 600 is denoted by $u_i$ (O2 in FIG. 3), a digital signal of the baseband signal obtained by down-conversion of an output signal from the amplification unit 100 is denoted by $y_i$ (I2 in FIG. 3). The order of the polynomial model is denoted by j and a time-series tap is denoted by i. The predistorter 600 adds distortion expressed by the relational expression shown in FIG. 10A to the transmission signal input into the predistorter 600. The parameter g is determined so that the parameter g satisfies the relational expression shown in FIG. 10B. The parameter g can be obtained by using the least-squares method, the gradient method or the like. The controller 700 uses the obtained parameter g to control the predistorter 600. The inverse of distortion of the output signal from the amplification unit 100 is added to the baseband signal.

The baseband signal $x_i$ synchronizes with the digital signal $y_i$ of the baseband signal generated by down-conversion. A coefficient of correlation between the baseband signal $x_i$ and the digital signal $y_i$ is calculated and a signal delay in the DSP 1800 is adjusted so that the value of the coefficient of correlation is maximized.

The amplitude component of the transmission signal is output from I1 of the DSP 1800 and is converted to an envelope signal through the DAC 1100 and an LPF 1400. The envelope extractor 2000 in FIG. 2 is implemented by the DSP 1800 and the DAC 1100. The envelope signal is input into the power supply modulator 300. The power supply modulator 300 amplifies the input envelope signal. The power supply modulator 300 supplies power to the amplification circuit 102 through the choke coil 101.

Carrier frequency band components of the output signal from the amplification circuit 102 are reduced by the LPF 1500 and the resulting signal is converted to a digital signal by the ADC 1700. The ADC 1700 outputs the converted digital signal to I1 of the DSP 1800. Here, the LPF 1500 is configured so that matching of the impedance of the LPF 1500 viewed from amplification circuit 102 and the impedance of the amplification circuit 102 is maintained. Further, the LPF 1500 is configured so that gain and phase have a flat frequency dependence in the baseband frequency band and gain decreases in the carrier frequency band.

Since the predistorter 600, the predistorter 200 and the shaping unit 1000 in the DSP 1800 operate successively in response to temperature change characteristics and aging characteristics of the amplification unit 100, the amplifier according to this embodiment performs stable distortion compensation.

Figure 4:
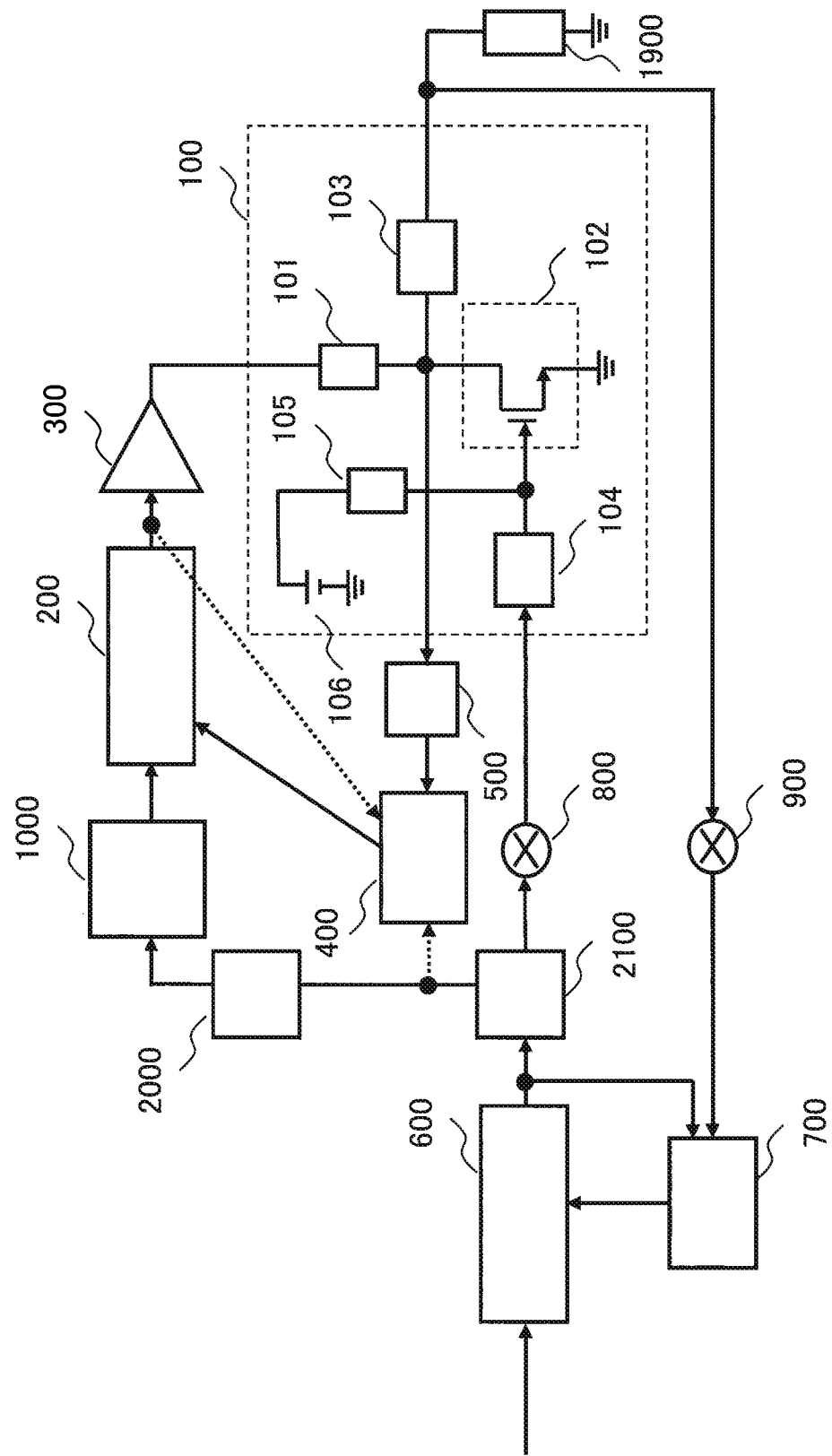
FIG. 4 shows functional blocks of a modified example of the amplifier according to the third embodiment.

As shown in FIG. 4, an output signal from the predistorter 600 may be input into the controller 700 instead of the same signal as the transmission signal input into the predistorter 600. An output signal from the predistorter 600 may be input into the predistorter 200 instead of the output signal from the shaping unit 1000. FIG. 4 shows an example in which an output signal from the branching unit 2100 is input into the predistorter 200 as an output signal from the predistorter 600.

While an example has been given in which the controller 700 uses a polynomial model to determine distortion added at the predistorter 600 in the configuration described above, the present invention is not limited to this. Modulation may be performed on the basis of corrections stored in an LUT (Look Up Table) according to the amplitude of a transmission signal input into the predistorter 600. A model for distortion of an output signal from the amplification unit 100 may be assumed and its inverse model may be computed. The configuration of the amplifier of the present invention is not limited to the embodiments described above.

Figure 5:
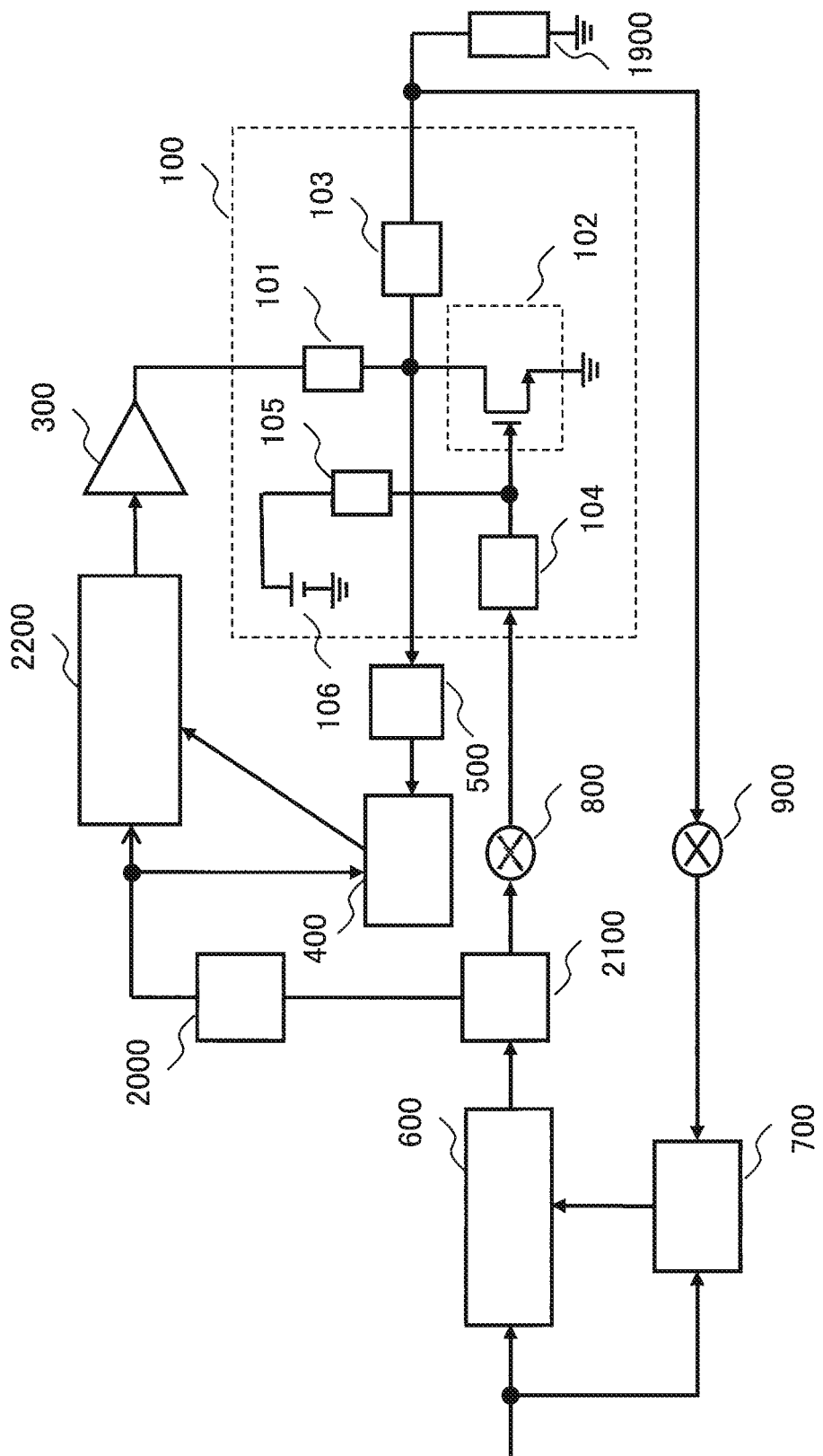
FIG. 5 shows functional blocks of a modified example of the amplifier according to the third embodiment.

As shown in FIG. 5, one predistorter 2200 may include the function of the shaping unit 1000 and the function of the predistorter 200.

A preamplifier may be disposed before the amplification unit 100.

The DSP 1800 may be configured in combination with a processor such as an FPGA (Field-Programmable Gate Array).

Figure 6:
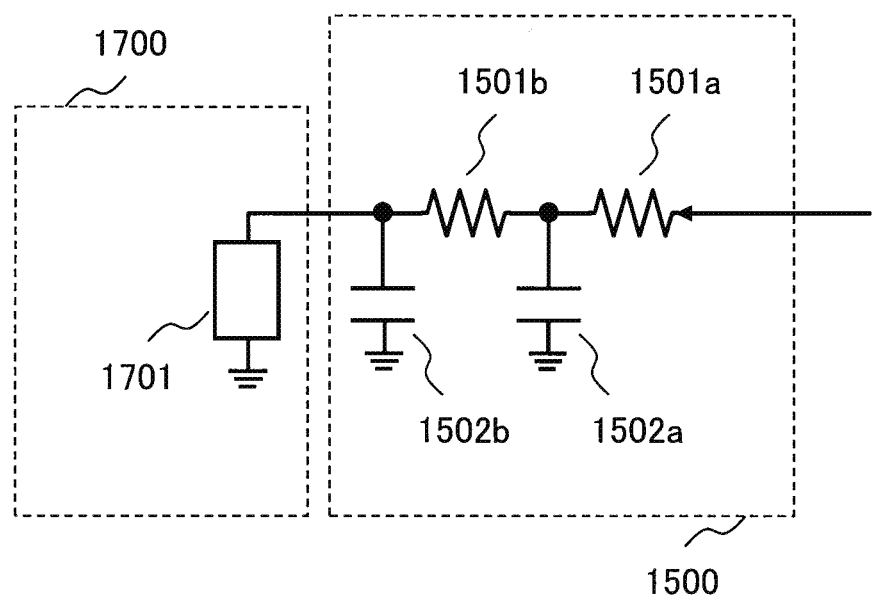
FIG. 6 Shows an example of circuit of an LPF 1500.

Next, an example of the LPF 1500 will be described. FIG. 6 shows an example of a circuitry of the LPF 1500 in FIG. 3.

The LPF 1500 includes resistances 1501a, 1501b and capacitors 1502a, 1502b. When the impedance viewed from the amplification circuit 102 is not high, a large value is set on the resistance 1501a so that matching of the amplification circuit 102 is not affected. Other parameters are set so that gain has a flat frequency dependence in the baseband signal frequency band and decreases in the carrier frequency band with the input impedance of the ADC 1700 as a load 1701.

Inductors may be used instead of the resistances 1501a, 1501b.

The number of resistance stages may be two or more. A Butterworth filter or a Chebyshev filter or the like may be used as the LPF 1500.

The Fourth Embodiment

An amplifier according to a fourth embodiment will be described with reference to FIG. 7.

Figure 7:
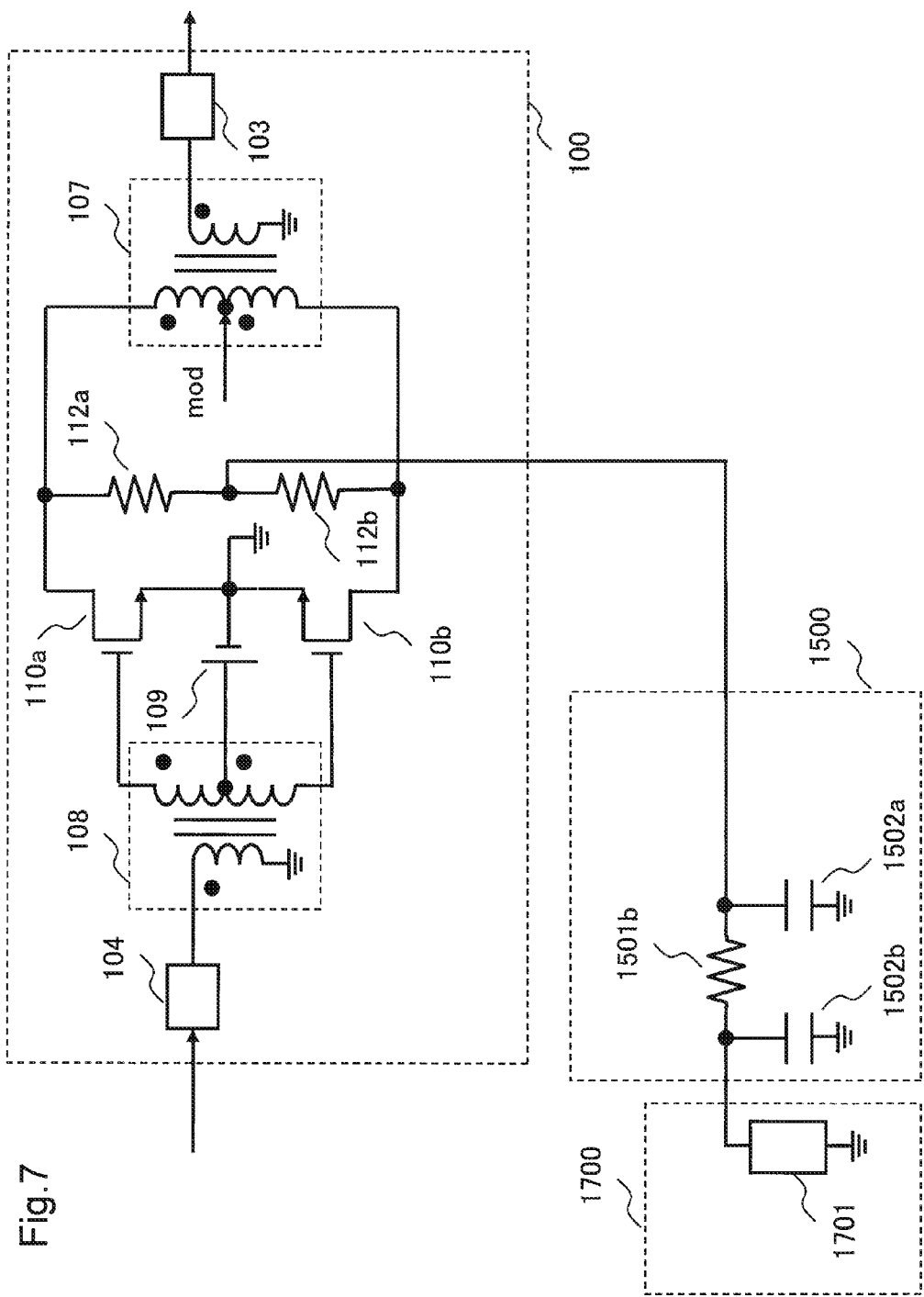
FIG. 7 shows an example of functional blocks of an amplifier according to a fourth embodiment.

FIG. 7 shows a configuration in which an additional amplification circuit is added to the amplification unit 100 in FIG. 3. In the amplifier shown in FIG. 7, the two amplification circuits perform push-pull operation. While a configuration that uses FETs as the amplifiers is described in this embodiment, the type of amplifiers is not limited to FET.

In FIG. 7, an input signal passes through a matching circuit 104 and is combined with a power supply 109 through a transformer 108. The combined signal is input into the gate terminals of FET 110a and FET 110b. The power supply 109 controls the gate voltages of the FET 110a and FET 110b to determine at which operating point among class AB, class B and class C the amplifier 100 operates. Output power mod from a power supply modulator 300 is supplied to the FET 110a and FET 110b through a transformer 107. The transformer 107 supplies output power to a load not depicted through a matching circuit 103.

The voltage at the drain terminals of the FET 110a and FET 110b are divided by resistances 112a and 112b and input into the ADC 1700 through the LPF 1500. The resistance values of the resistances 112a and 112b are twice the resistance value of the resistance 1501a as opposed to LPF 1500 according to the third embodiment. The other parameters are the same as those in the third embodiment. In this configuration, the LPF 1500 according to the fourth embodiment has the same characteristics as the LPF 1500 according to the third embodiment.

Note that the push-pull circuit is not limited to the configuration described above; a configuration of other push-pull circuit may be applied.

While output voltages from the two FETs are input into the LPF 1500 in the configuration described above, an output voltage from one of the FETs may be input into the LPF 1500.

While the present invention has been described with preferred embodiments, the present invention is not limited to the embodiments described above and can be implemented with various modifications without departing from the technical spirit thereof. Combinations of some or all of the components of the embodiment described above also fall within the scope of the present invention.

For example, while embodiments have been described mainly using an FET as the amplification circuit 102 in the embodiments described above, a bipolar transistor or electron tube may be used as the amplification circuit 102.

If a bipolar transistor is used as the amplification circuit 102, the output signal from the choke coil 101 is input into the collector terminal of the bipolar transistor and the input signal is input into the base terminal of the bipolar transistor.

This application claims priority based upon Japanese Patent Application 2012-081595 filed on 30 Mar. 2012, the entire disclosure of which is incorporated herein by reference.

INDUSTRIAL APPLICABILITY

The present invention is not limited to the embodiments described above and is suitably applicable to any amplifiers and amplification methods used in communication.

REFERENCE SIGNS LIST

100 Amplification unit
101, 105 Choke coil
102 Amplification circuit
103, 104 Matching circuit
106, 109 Power supply
107, 108 Transformer
110a, 110b FET
112a, 112b, 1501a, 1501b Resistance
200, 600, 2200 Predistorter
300 Power supply modulator
400, 700 Controller
500 Filter
800 Up-converter
900 Down-converter
1000 Shaping unit
1100 DAC
1200 BPF
1300, 1400, 1500, 1600 LPF
1502a, 1502b Capacitor
1700 ADC
1701, 1900 Load
1800 DSP
2000 Envelope extractor
2100 Branching unit

The invention claimed is:

1. An amplifier comprising:
an amplification unit;
a power supply modulator determining a modulation voltage to be applied to the amplification unit according to an input signal input into the amplification unit;
a first predistorter modeling a characteristic of the amplification unit and compensating for distortion in the amplification unit;
a first controller controlling a parameter of the first predistorter on the basis of an input signal input into the first predistorter and an output signal from the amplification unit;
a second predistorter modulating an input signal input into the power supply modulator; and
a second controller controlling the second predistorter on the basis of a signal from which a radio frequency component of a drain voltage of a field effect transistor in the amplification unit has been removed and the input signal input into the power supply modulator;
wherein correction is performed such that the signal from which the radio frequency component of the drain voltage of the field effect transistor is linearized.

2. The amplifier according to claim 1, comprising a low-pass filter disposed at the drain of the field effect transistor, the low-pass filter outputting the signal obtained by removing the radio frequency component from the drain voltage of the field effect transistor.

3. The amplifier according to claim 1,
wherein the second controller compares the input signal input into the amplification unit with the signal from which the radio frequency component of the drain voltage of the field effect transistor has been removed, computes an inverse parameter of distortion, and controls the second predistorter.

4. The amplifier according to claim 1,
wherein the first controller compares the input signal input into the amplification unit with the output signal from the amplification unit, computes an inverse parameter of distortion, and controls the first predistorter.

5. The amplifier according to claim 1,
wherein the power supply modulator comprises a linear amplification unit linearly amplifying an input signal input into the amplification unit and outputting a resulting signal and a shaping unit modifying the input signal input into the amplification unit according to an amplitude value.

6. The amplifier according to claim 1,
wherein the amplification unit comprises a field effect transistor, an input matching unit, an input radio frequency choke, a power supply, an output matching unit, and output radio frequency choke.

7. The amplifier according to claim 1,
wherein the field effect transistor is replaced with a bipolar transistor or an electron tube.

8. An amplification method for amplifying an input signal input into an amplification unit, the amplification method comprising:
determining, in a power supply modulator, a modulation voltage to be applied to the amplification unit according to an input signal input into the amplification unit;
controlling a parameter of a first predistorter on the basis of an input signal input into the first predistorter and an output signal from the amplification unit, the first predistorter modeling a characteristic of the amplification unit to compensate for distortion in the amplification unit;
modulating, in a second predistorter, an input signal input into the power supply modulator;
controlling the second predistorter on the basis of a signal from which a radio frequency component of a drain voltage of an field effect transistor in the amplification unit has been removed and the input signal input into the power supply modulator; and
performing correction such that the signal from which the radio frequency component of the drain voltage of the field effect transistor is linearized.

* * * * *